United States Patent
Tokuda

(10) Patent No.: US 9,196,720 B2
(45) Date of Patent: Nov. 24, 2015

(54) SEMICONDUCTOR DEVICE AND METHOD OF MANUFACTURING SEMICONDUCTOR DEVICE

(71) Applicant: Renesas Electronics Corporation, Kanagawa (JP)

(72) Inventor: Satoru Tokuda, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 3 days.

(21) Appl. No.: 14/152,233

(22) Filed: Jan. 10, 2014

(65) Prior Publication Data

US 2014/0210000 A1    Jul. 31, 2014

(30) Foreign Application Priority Data

Jan. 31, 2013  (JP) ................................. 2013-017588

(51) Int. Cl.
*H01L 29/768* (2006.01)
*H01L 29/78* (2006.01)
*H01L 29/66* (2006.01)
*H01L 29/423* (2006.01)

(52) U.S. Cl.
CPC ........ *H01L 29/7811* (2013.01); *H01L 29/4236* (2013.01); *H01L 29/66734* (2013.01); *H01L 29/7813* (2013.01)

(58) Field of Classification Search
None
See application file for complete search history.

(56) References Cited

U.S. PATENT DOCUMENTS

| | | | |
|---|---|---|---|
| 6,800,535 B1 * | 10/2004 | Tsai et al. | 438/386 |
| 8,222,693 B2 | 7/2012 | Koops et al. | |
| 2007/0158726 A1 * | 7/2007 | Sim et al. | 257/301 |
| 2007/0290260 A1 * | 12/2007 | Adan | 257/330 |
| 2008/0315303 A1 * | 12/2008 | Vannucci et al. | 257/334 |
| 2009/0090967 A1 | 4/2009 | Chen et al. | |
| 2013/0075760 A1 | 3/2013 | Takaya et al. | |

FOREIGN PATENT DOCUMENTS

| | | |
|---|---|---|
| JP | 2002-299618 | 10/2002 |
| JP | 2007-528598 | 10/2007 |
| JP | 2010-541289 | 12/2010 |
| JP | 2012-019188 | 1/2012 |

\* cited by examiner

*Primary Examiner* — Su C Kim

(74) *Attorney, Agent, or Firm* — Young & Thompson

(57) ABSTRACT

A first lower insulating film (LIL1) is formed on the bottom surface and a lower portion of the side surface of a first concave portion (gate trench) and is thicker than a gate insulating film (GIF). An upper end of LIL1 is connected to a lower end of the GIF. A second lower insulating film is formed on the bottom surface and a lower portion of the side surface of a second concave portion (termination trench). An upper insulating film (UIF) is formed at an upper portion of the side surface of the second concave portion and a lower end is connected to an upper end of LIL2. The depth of the second concave portion is ≥90% and ≤110% of the depth of the first concave portion. The thickness of LIL2 is ≥95% and ≤105% of the thickness of LIL1. The UIF is thicker than the GIF.

6 Claims, 13 Drawing Sheets

SEMICONDUCTOR DEVICE AND METHOD OF MANUFACTURING SEMICONDUCTOR DEVICE

This application is based on Japanese patent application No. 2013-017588, the content of which is incorporated hereinto by reference.

BACKGROUND

1. Technical Field

The invention relates to a semiconductor device and a method of manufacturing a semiconductor device and it is a technique capable of being applied to a semiconductor device provided with a vertical transistor having, for example, a trench gate structure.

2. Related Art

As one type of semiconductor device, there is a semiconductor device having a vertical transistor. The vertical transistor is used for, for example, an element which controls a large current. As the vertical transistor, there is a transistor having a trench gate structure. The trench gate structure is a structure in which a concave portion is formed in a semiconductor substrate, a gate insulating film is formed on the side surface of the concave portion, and a gate electrode is then embedded in the concave portion.

In recent years, there have been structures where a termination trench is provided outside a trench gate when seen in a plan view in each of the structures (refer to, for example, Japanese Unexamined Patent Application Publication No. 2002-299618, Japanese Unexamined Patent Application Publication (Translation of PCT Application) No. 2007-528598, Japanese Unexamined Patent Application Publication No. 2012-19188, and Japanese Unexamined Patent Application Publication (Translation of PCT Application) No. 2010-541289).

The structure described in Japanese Unexamined Patent Application Publication No. 2002-299618 is a structure in which a termination trench is formed to be shallower than a trench gate.

In Japanese Unexamined Patent Application Publication (Translation of PCT Application) No. 2007-528598, it is described where a film structure of the insulating film formed on the side surface of a termination trench is different from a film structure of the gate insulating film. Specifically, an additional insulating film is deposited on the insulating film of the same layer as the gate insulating film at a lower portion of the side surface and the bottom surface of a trench gate and on the side surface and the bottom surface of the termination trench. Furthermore, the additional insulating film is not formed on the side facing a trench electrode, of an upper portion of the side surface of the termination trench.

The structure described in Japanese Unexamined Patent Application Publication No. 2012-19188 is a structure in which an insulating film on the bottom surface of a termination trench is made thinner than an insulating film on the bottom surface of a trench gate.

The structure described in Japanese Unexamined Patent Application Publication (Translation of PCT Application) No. 2010-541289 is a structure in which an insulating film on the bottom surface and the side surface of a termination trench is made thicker than an insulating film (including a gate insulating film) on the bottom surface and the side surface of a trench gate.

SUMMARY

As one of characteristics required in a transistor, there is a low ON-resistance. As a result of a study carried out by the inventors of the present invention, it was found that in a case of providing an embedded electrode which becomes a termination trench, electric field strength was increased at a gate oxide film of the termination trench at the time of application of drain voltage and thus a gate insulating film was subjected to dielectric breakdown occasionally. As means for preventing this, thickening of the gate insulating film can be used, however, the thickening may result in an increase in ON-resistance.

Other tasks and novel features will be apparent from the description of this specification and the accompanying drawings.

In one embodiment, a gate insulating film is formed at an upper portion of the side surface of a first concave portion. The first concave portion is formed in a base layer and a lower end thereof is located in a low-concentration impurity layer. A first lower insulating film is formed on the bottom surface and a lower portion of the side surface of the first concave portion and is thicker than the gate insulating film. Further, an upper end of the first lower insulating film is connected to a lower end of the gate insulating film. A gate electrode is embedded in the first concave portion. A source layer is a first conductivity type, is formed in a base layer to be shallower than the base layer, and is located next to the first concave portion when seen in a plan view. A second lower insulating film is formed on the bottom surface and a lower portion of the side surface of a second concave portion. An upper insulating film is formed at an upper portion of the side surface of the second concave portion and a lower end thereof is connected to an upper end of the second lower insulating film. The second concave portion surrounds the first concave portion when seen in a plan view. An embedded electrode is embedded in the second concave portion. Then, the depth of the second concave portion is greater than or equal to 90% and less than or equal to 110% of the depth of the first concave portion. Further, the thickness of the second lower insulating film is greater than or equal to 95% and less than or equal to 105% of the thickness of the first lower insulating film. Then, the upper insulating film is thicker than the gate insulating film.

According to one embodiment described above, an increase in electric field strength in the gate insulating film of a termination trench at the time of application of drain voltage can be suppressed, and thus reliability can be improved.

BRIEF DESCRIPTION OF THE DRAWINGS

The aforementioned object and other objects, advantages and features of the present invention will be more apparent from the following description of certain preferred embodiments taken in conjunction with the accompanying drawings, in which.

DETAILED DESCRIPTION

Figure 1A:
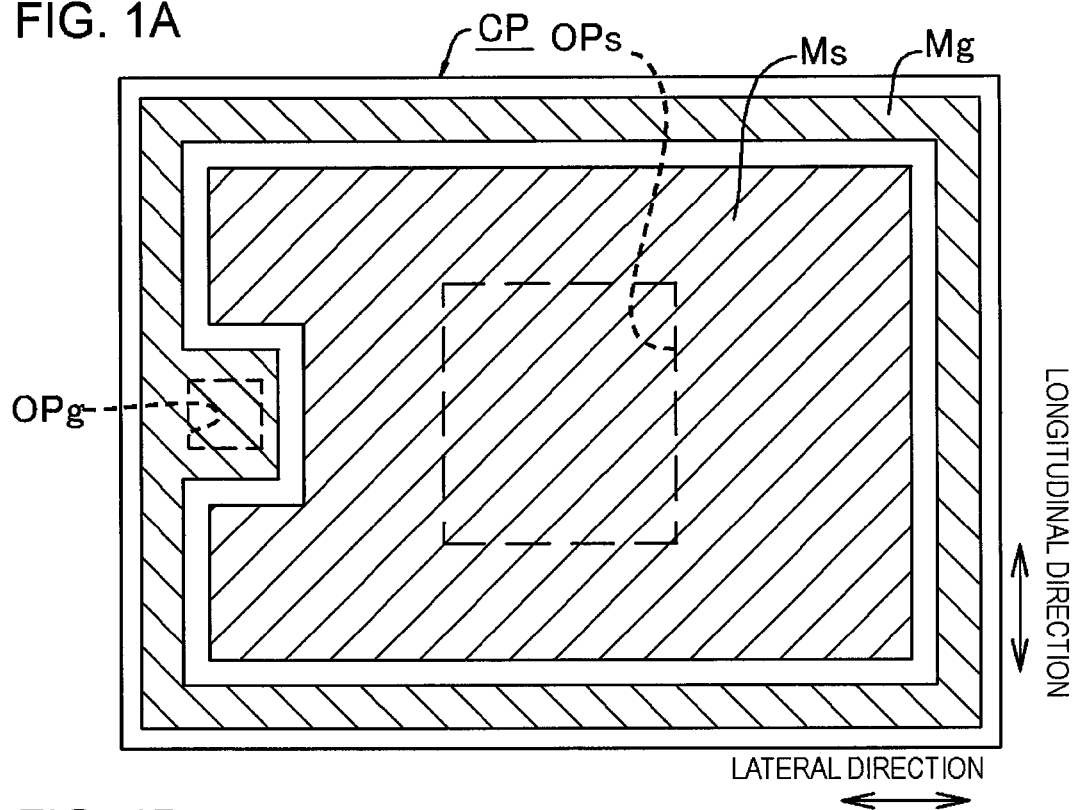
FIGS. 1A and 1B are plan views of a semiconductor device according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments will be described using the drawings. In addition, in all of the drawings, the same constituent element is denoted by the same reference numeral and description thereof will not be repeated.

(First Embodiment)

Figure 1B:
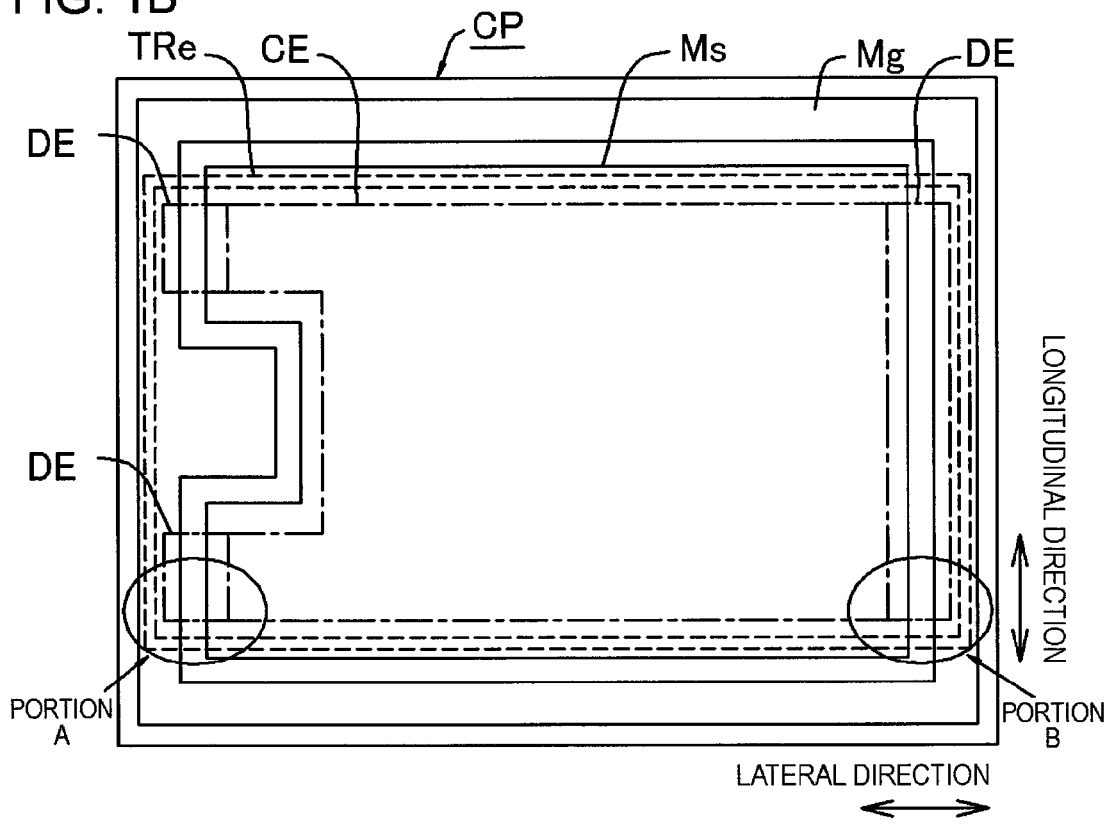
Figure 2A:
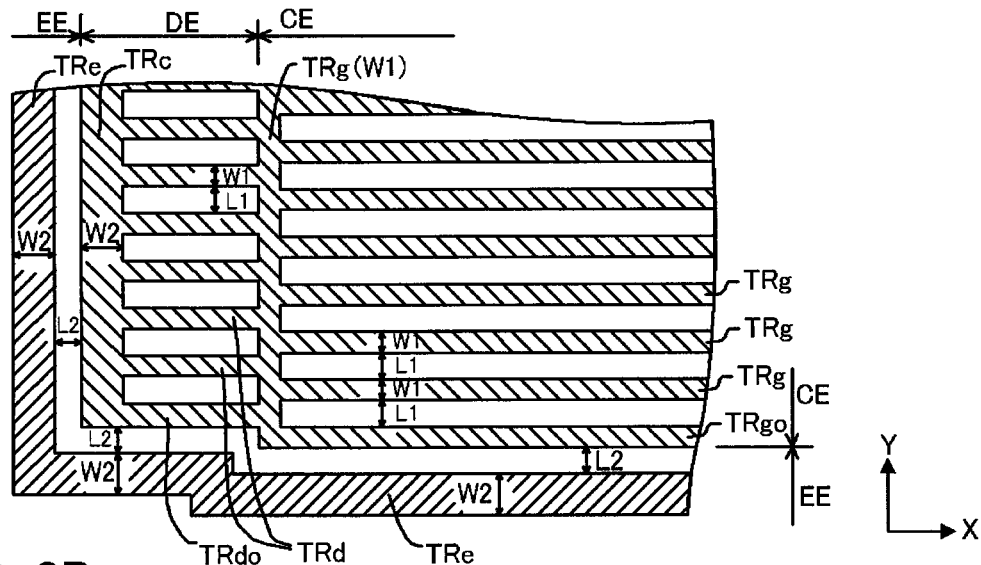
FIGS. 2A and 2B are enlarged plan views of a main section of the semiconductor device.
Figure 2B:
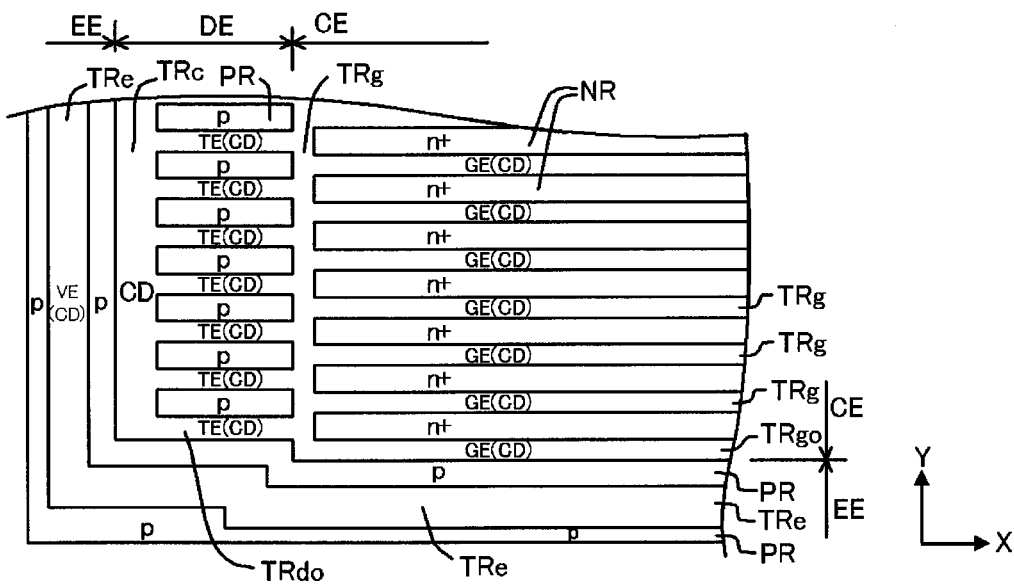
Figure 3:
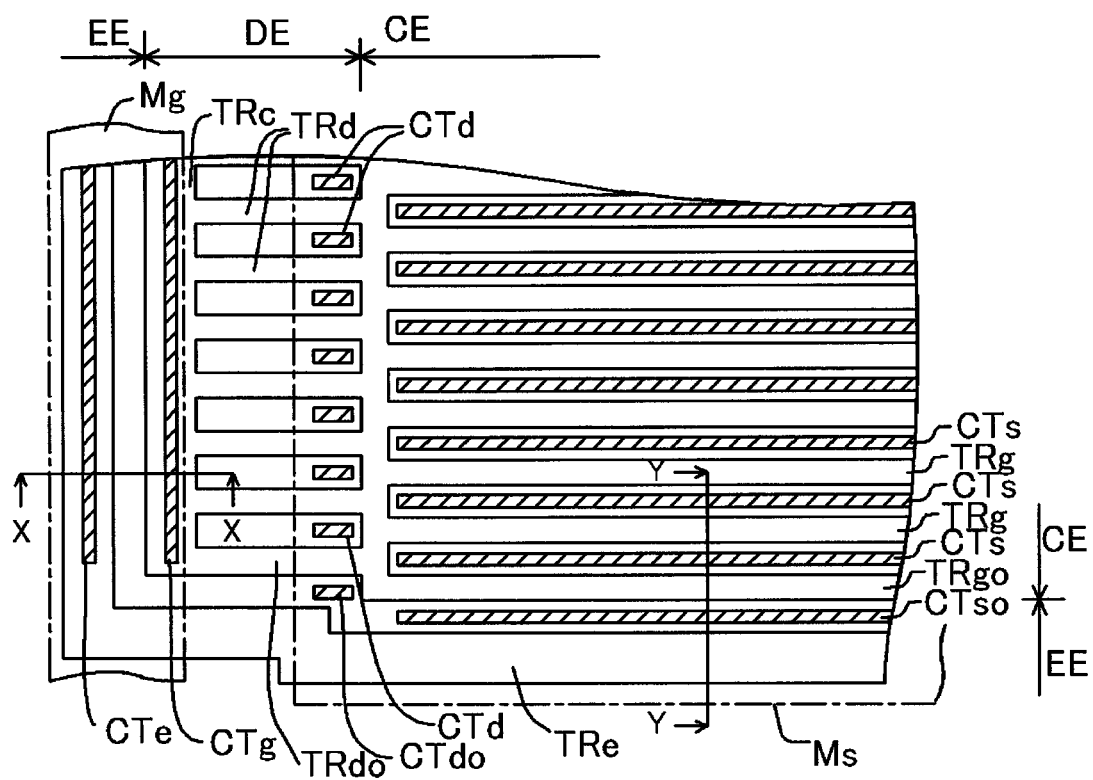
FIG. 3 is an enlarged plan view of the main section of the semiconductor device.
Figure 4A:
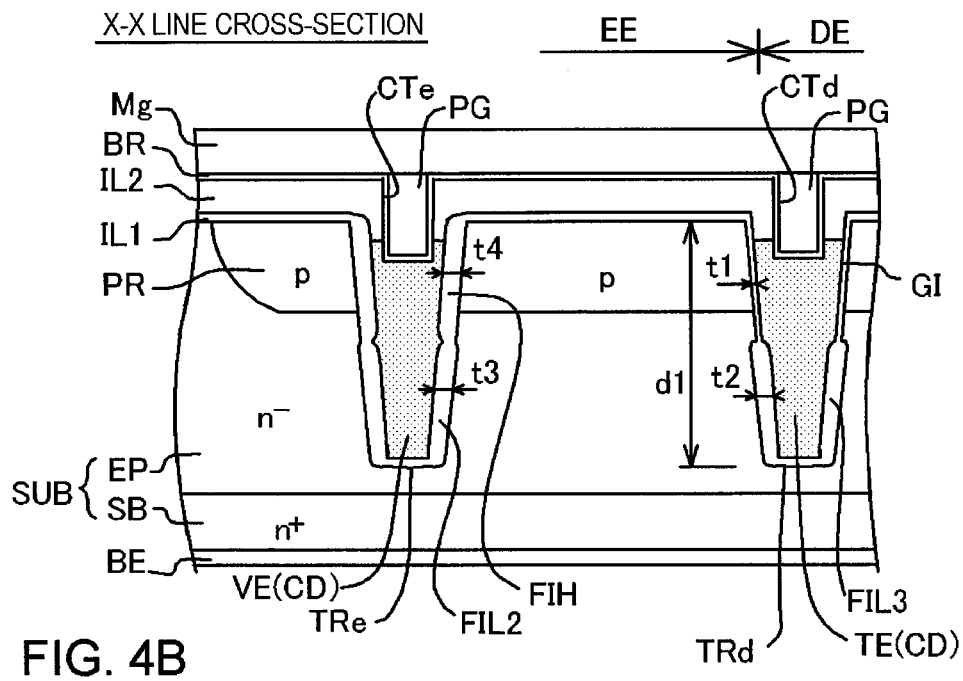
FIGS. 4A and 4B are cross-sectional views of the semiconductor device.
Figure 4B:
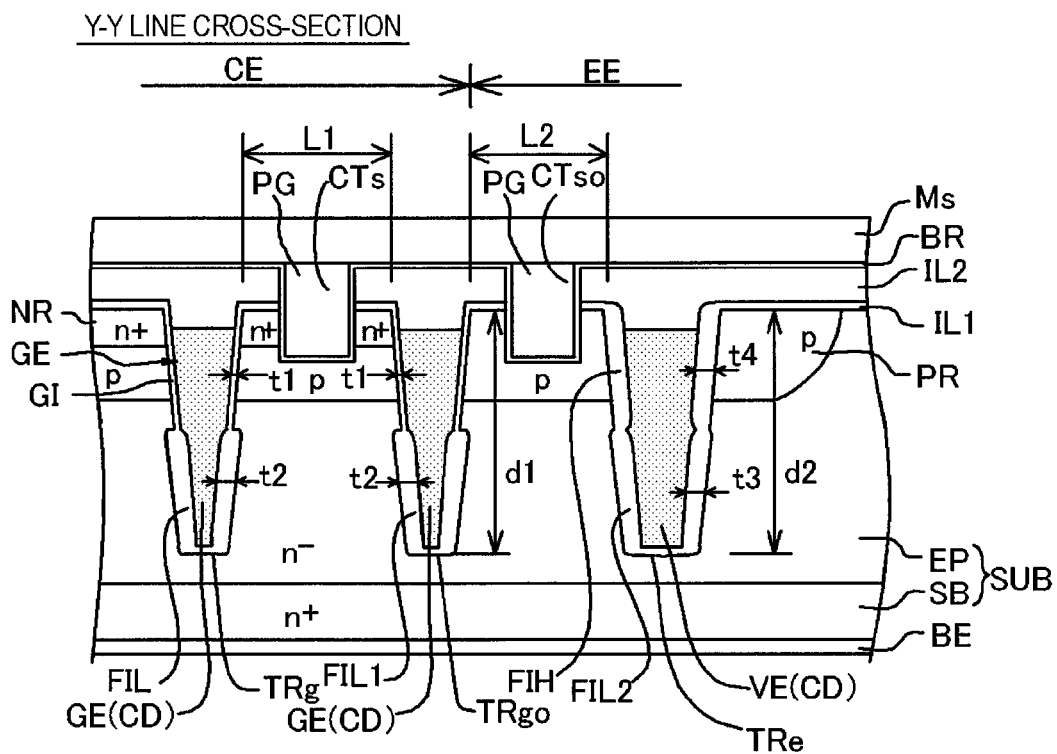

A semiconductor device according to a first embodiment will be described with reference to FIGS. 1A to 4B. FIGS. 1A and 1B are plan views of the semiconductor device according to this embodiment. FIGS. 2A, 2B, and 3 are enlarged plan views of a main section of the semiconductor device. FIGS. 4A and 4B are cross-sectional views of the semiconductor device.

In FIGS. 1A to 4B, reference numeral CE denotes a cell region, DE denotes a gate lead-out region, EE denotes an outer peripheral region, TRg denotes a gate trench, TRd denotes a lead-out trench, TRe denotes a termination trench, CTs, CTd, and CTg denote contact holes, Ms denotes a source wiring, Mg denotes a gate wiring, PG denotes a plug, BR denotes a barrier metal film, Ops and OPg denote opening portions, SUB denotes a substrate, SB denotes a substrate main body, EP denotes an epitaxial layer, GE denotes a gate electrode, PR denotes a p-type region, NR denotes an n-type region, GI denotes a gate insulating film, CD denotes an electric conductor, FIL1 denotes a first lower insulating film, FIL2 denotes a second lower insulating film, FIH denotes an upper insulating film, BE denotes a back electrode, and VE denotes an embedded electrode.

The semiconductor device according to this embodiment is provided with a drain layer (the substrate main body SB), a low-concentration impurity layer (the epitaxial layer EP), a base layer (the p-type region PR), the gate insulating film GI, the gate electrode GE, the first lower insulating film FIL1, the second lower insulating film FIL2, a source layer (the n-type region NR), the upper insulating film FIH, and the embedded electrode VE. The drain layer (the substrate main body SB) is a first conductivity type (in the following description, referred to as an n-type). The low-concentration impurity layer (the epitaxial layer EP) is an n-type, is formed on the drain layer (the substrate main body SB), and has a lower impurity concentration than the drain layer (the substrate main body SB). The base layer (the p-type region PR) is a second conductivity type (in the following description, referred to as a p-type) and is located on the low-concentration impurity layer (the epitaxial layer EP). The gate insulating film GI is formed at an upper portion of the side surface of a first concave portion (the gate trench TRg). The first concave portion (the gate trench TRg) is formed in the base layer (the p-type region PR) and a lower end thereof is located in the low-concentration impurity layer (the epitaxial layer). The first lower insulating film FIL1 is formed on the bottom surface and a lower portion of the side surface of the first concave portion (the gate trench TRg) and is thicker than the gate insulating film GI. Further, an upper end of the first lower insulating film FIL1 is connected to a lower end of the gate insulating film GI. The gate electrode GE is embedded in the first concave portion (the gate trench TRg). The source layer (the n-type region NR) is an n-type, is formed in the base layer (the p-type region PR) to be shallower than the base layer (the p-type region PR), and is located next to the first concave portion (the gate trench TRg) when seen in a plan view. The second lower insulating film FIL2 is formed on the bottom surface and a lower portion of the side surface of a second concave portion (the termination trench TRe). The upper insulating film FIH is formed at an upper portion of the side surface of the second concave portion (the termination trench TRe) and a lower end thereof is connected to an upper end of the second lower insulating film FIL2. The second concave portion (the termination trench TRe) surrounds the first concave portion (the gate trench TRg) when seen in a plan view. The embedded electrode VE is embedded in the second concave portion (the termination trench TRe).

Then, the depth of the second concave portion (the termination trench TRe) is greater than or equal to 90% and less than or equal to 110% of the depth of the first concave portion (the gate trench TRg). Further, the thickness of the second lower insulating film FIL2 is greater than or equal to 95% and less than or equal to 105% of the thickness of the first lower insulating film FIL1. Then, the upper insulating film FIH is thicker than the gate insulating film GI.

Hereinafter, detailed description will be made.

First, an outline of the layout of a wiring of the semiconductor device will be described with reference to FIG. 1A. FIG. 1A is a plan view and illustrates areas in which the gate wiring Mg and the source wiring Ms of the semiconductor device are formed, with hatched portions. The source wiring Ms is provided at a central portion of the semiconductor device. The gate wiring Mg is formed annularly along the edge of the semiconductor device so as to surround the source wiring Ms. Each of the source wiring Ms and the gate wiring Mg is covered with a passivation film (not illustrated) made of, for example, a nitride film, a polyimide film, or the like. The opening portions Ops and OPg (opening positions are illustrated by dashed lines) for bonding a metal wire or the like are respectively provided in predetermined areas of the passivation film.

Next, the layouts of the cell region CE, the gate lead-out region DE, and the termination trench TRe will be described with reference to a plan view of FIG. 1B. In the drawing, the cell region CE and the gate lead-out region DE are illustrated by dashed-dotted lines and the termination trench TRe is illustrated by a chain line. The cell region CE is provided at the central portion of the semiconductor device. A plurality of cell transistors is arranged in the cell region CE. Each cell transistor has the gate electrode GE having a trench structure. The source wiring Ms is formed so as to cover the cell region CE. The gate lead-out regions DE are provided at two corners (for example, both sides of a short side on one side) coming into contact with the same side, of four corners of the cell region CE. The gate lead-out region DE is a region for leading out the gate electrode GE of the cell transistor to the outside of the cell region CE. The gate electrode GE is led out in both lateral directions of the drawing and is not led out in a longitudinal direction.

That is, when seen in the lateral direction, the gate lead-out region DE is interposed between the cell region CE and the termination trench TRe. However, when seen in the longitudinal direction, the cell region CE and the termination trench TRe are adjacent to each other.

When seen in a plan view, the gate wiring Mg is annularly formed so as to surround the cell region CE (the source wiring Ms) while overlapping the termination trench TRe extending in the longitudinal direction and a portion of the gate lead-out region DE. The termination trench TRe is annularly formed to be spaced apart by a certain distance from the cell region CE and the gate lead-out region DE so as to surround the cell region CE and the gate lead-out region DE. The gate wiring Mg is formed on the terminal trench TRe extending in the longitudinal direction in the drawing to overlap the terminal trench TRe.

Next, the layouts of trenches and diffusion layers will be described with reference to FIGS. 2A and 2B. FIGS. 2A and 2B are enlarged plan views of a portion A in FIG. 1B. Although it is not illustrated in the drawing, a portion B in FIG. 1B is disposed line-symmetrically with the portion A on the basis of a line extending in a vertical direction in the drawing. Further, in FIG. 2A, areas in which the trenches are formed are illustrated by diagonal lines.

In the cell region CE, a large number of stripe-shaped gate trenches TRg extending in the lateral direction (an X direction) are arranged side by side in a Y direction in the drawing at an equal pitch (a distance L1 between adjacent trenches). All of the ends of the large number of gate trenches TRg are connected to the gate trench TRg extending in the longitudinal direction (the Y direction). The cell transistor is a vertical metal oxide semiconductor (MOS) having a trench gate structure and the gate trench TRg is a trench for embedding the electric conductor CD serving as the gate electrode GE configuring the cell transistor.

In the gate lead-out region DE, a large number of lead-out trenches TRd (third concave portions) extending in the lateral direction (the X direction in the drawing) are arranged parallel to each other in the Y direction in the drawing at an equal pitch (the distance L1 between adjacent trenches). All of the sides on one side of the large number of lead-out trenches TRd are connected to the gate trench TRg extending in the longitudinal direction (the Y direction in the drawing) and all of the other sides are connected to a lead-out trench TRc extending in the longitudinal direction (the Y direction in the drawing).

The lead-out trench TRd is formed successively and integrally with the gate trench TRg. That is, the lead-out trench TRd is connected to the gate trench TRg. The lead-out trench TRd is a trench for embedding the electric conductor CD which leads out the gate electrode GE to the outside of the cell region CE.

The termination trench TRe is provided in the outer peripheral region EE of the semiconductor device and is provided to be spaced apart by a certain distance L2 from all of an outermost gate trench TRgo, a lead-out trench TRdo which is located on the outermost side, and a lead-out trench TRc extending in the longitudinal direction. The termination trench TRe is provided in order to relax electric field strength by making an insulating film on a side wall thereof thick and prevent the occurrence of dielectric breakdown or leakage. The distance L2 is equal to or narrower than the disposition interval L1 of the gate trenches TRg.

The gate electrode GE (the electric conductor CD filling up the inside of the gate trench TRg) and a lead-out electrode TE (the electric conductor CD filling up the inside of the lead-out trench TRd) are formed successively to and integrally with each other. The embedded electrode VE (the electric conductor CD filling up the inside of the termination trench TRe) is connected to the gate electrode GE through the plug PG embedded in the contact hole CTg (described later) and the gate wiring Mg. In addition, the electric conductors CD filling up the insides of the trenches TRg, TRd, TRc, and TRe are, for example, doped polysilicon.

All of the widths of the gate trench TRg extending in the lateral direction, the gate trench TRg extending in the longitudinal direction, and the lead-out trench TRd extending in the lateral direction are formed to be the same width of W1. The lead-out trench TRc extending in the longitudinal direction has a width W2 wider than the width W1 in order to secure a space for forming a contact (described later) (W1<W2). Further, the termination trench TRe also has the width W2 wider than the width W1 in order to secure a space for forming a contact (described later) (W1<W2). All of the depths (distances from the surface of the substrate to the bottom surface of the trench) of the trenches TRg, TRd, TRc, and TRe are almost the same depth. However, a certain amount of variation occasionally occurs in these depths. Even in this case, in most cases, the depth of the termination trench TRe is greater than or equal to 90% and less than or equal to 110% of the depth of the gate trench TRg.

The n-type region NR with $n^+$ type impurities introduced therein is formed in a surface layer of the cell region CE.

The p-type region PR with p-type impurities introduced therein is formed in a surface layer of the gate lead-out region DE. The p-type region PR is formed in a surface layer of the outer peripheral region EE. The p-type region PR is formed in an area between the termination trench TRe and the gate trench TRgo closest to the termination trench TRe. However, the p-type region PR is also formed in a predetermined area outside the termination trench TRe.

Next, the layout of the contact holes will be described with reference to FIG. 3. FIG. 3 is a plan view and illustrates portions in which the contact holes are formed, by diagonal lines. A plug made of, for example, tungsten is buried in the contact hole and electrically connects a semiconductor layer under an insulating interlayer and a gate wiring/a source wiring over the insulating interlayer.

In the cell region CE, the contact hole CTs is provided along the gate trench TRg between the gate trenches TRg extending in the lateral direction and adjacent to each other. Further, a contact hole CTso is formed along the gate trench TRg between the outermost gate trench TRgo and the termination trench TRe extending in the lateral direction. In the gate lead-out region DE, the contact hole CTd is provided between the lead-out trenches TRd extending in the lateral direction and adjacent to each other. Further, a contact hole CTdo is formed between the outermost lead-out trench TRdo and the termination trench TRe extending in the lateral direction. All of the contact holes CTd and CTdo are disposed to be biased to the cell region CE side (that is, the side away from the gate wiring Mg). In this way, the distance between the gate wiring Mg and the source wiring Ms can be sufficiently secured.

The contact hole CTg (a first contact) is disposed over the lead-out trench TRc extending in the longitudinal direction. A contact hole CTe (a second contact) is disposed over the termination trench TRe extending in the longitudinal direction.

Next, a cross-sectional structure of the semiconductor device will be described with reference to FIGS. 4A and 4B. FIGS. 4A and 4B respectively are cross-sectional views taken along lines X-X and Y-Y of FIG. 3. That is, FIG. 4A illustrates cross-sectional structures of the gate lead-out region DE and the outer peripheral region EE. FIG. 4B illustrates cross-sectional structures of the cell region CE and the outer peripheral region EE.

As illustrated in FIG. 4B, the substrate SUB has the substrate main body SB made of n+ type silicon, and the n− type epitaxial layer EP on the substrate main body SB. The substrate main body SB is a bulk silicon substrate. The epitaxial layer EP is a silicon layer epitaxially grown on the substrate main body SB.

The gate trench TRg is provided in the cell region CE. The upper side wall of the gate trench TRg is covered with the gate insulating film GI (film thickness: t1). The lower side wall of the gate trench TRg is covered with the first lower insulating film FIL1 (film thickness: t2) which is thicker than the gate insulating film GI (t1<t2). The electric conductor CD made of doped polysilicon is buried in the gate trench TRg. The electric conductor CD functions as the gate electrode GE. The lower end of the gate insulating film GI is connected to the upper end of the first lower insulating film FIL1.

The p-type region PR and the n-type region NR each having a predetermined depth are respectively formed in areas adjacent to the gate trench TRg, of the substrate SUB. The p-type region PR functions as a base region and the n-type region NR functions as a source region. However, the n-type region NR is not formed in the p-type region PR which is located between the outermost peripheral gate trench TRgo and the termination trench TRe.

The contact hole CTs passes through an insulating interlayer IL2, an insulating film IL1, and the n-type region NR in a thickness direction and penetrates to the middle of the p-type region PR. The contact hole CTso passes through the insulating interlayer IL2 and the insulating film IL1 in the thickness direction and is formed to the middle of the p-type region PR. The plugs PG made of tungsten are embedded in the contact holes CTs and CTso through the barrier metal BR. The plug PG electrically connects the p-type region PR and the n-type region NR to the source wiring Ms.

The termination trench TRe is provided in the outer peripheral region EE. A depth d2 of the termination trench TRe is almost the same as or slightly deeper than a depth d1 of the gate trench TRg (d1≈d2). As described in FIGS. 2A and 2B, the width W2 of the termination trench TRe is larger than the width W1 of the gate trench TRg (W1<W2). The upper side wall of the termination trench TRe is covered with the upper insulating film FIH and the lower side wall is covered with the second lower insulating film FIL2. In this embodiment, a thickness t4 of the upper insulating film FIH is almost the same as a thickness t3 of the second lower insulating film FIL2 (t3=t4). Further, here, the thickness t3 of the second lower insulating film FIL2 and a thickness t2 of the first lower insulating film FIL1 which covers the lower side wall of the gate trench TRg are the same thickness (t3=t2). However, t3 may be greater than or equal to 95% and less than or equal to 105% of t2

Then, the distance L2 between the outermost gate trench TRgo and the termination trench TRe is the same as or smaller than the distance L1 between the gate trenches TRg and TRgo adjacent to each other (L2≤L1).

As illustrated in FIG. 4A, the lead-out trench TRd is provided in the gate lead-out region DE. The depth of the lead-out trench TRd is the same depth as the depth d1 of the gate trench TRg. As described above, the width W2 of the lead-out trench TRd is larger than the width W1 of the gate trench TRg (W1<W2), similar to the termination trench TRe. An upper side wall of the lead-out trench TRd is covered with the gate insulating film GI (film thickness: t1). A lower side wall of the lead-out trench TRd is covered with an insulating film FIL3 (film thickness: t2) having the same thickness as the first lower insulating film FIL1 (film thickness: t2) on the lower side wall of the gate trench TRg. The electric conductor CD made of doped polysilicon is buried in the lead-out trench TRd. The electric conductor CD is the lead-out electrode TE which electrically connects the gate electrode GE and the gate wiring Mg.

Further, the p-type region PR is also formed in an area adjacent to the lead-out trench TRd, of the substrate SUB.

The contact hole CTd is provided over the lead-out trench TRd, and the contact hole CTe is provided over the termination trench TRe. Both the contact holes CTd and CTe pass through the insulating interlayer IL2. The plugs PG made of tungsten are embedded in the contact holes CTd and CTe through the barrier metal BR, as described above. The plugs PG electrically connect the lead-out electrode TE buried in the lead-out trench TRd and the embedded electrode VE buried in the termination trench TRe to the gate wiring Mg.

The insulating film IL1 and the insulating interlayer IL2 are formed on the surface of the substrate. Further, the gate wiring Mg is formed over the insulating interlayer IL2. In addition, the back electrode BE is formed on the rear surface of the substrate SUB. The back electrode BE functions as a drain electrode.

In addition, in the example illustrated in this drawing, the boundary between the gate insulating film GI and the first lower insulating film FIL1 in the side wall of the gate trench TRg is located in the epitaxial layer EP. Further, a step is formed at the boundary between the second lower insulating film FIL2 and the upper insulating film FIH in the side wall of the termination trench TRe, and this boundary is located in the epitaxial layer EP. However, there is also a case where there is no boundary between the second lower insulating film FIL2 and the upper insulating film FIH.

According to the semiconductor device described above, the upper insulating film which is located at an upper portion of the side wall of the termination trench TRe is thicker than the gate insulating film GI which is located at an upper portion of the side wall of the gate trench TRg. Then, even if great voltage is applied to the back electrode BE and thus electric field strength in the vicinity of the side wall of the termination trench TRe is increased, the occurrence of dielectric breakdown in the termination trench TRe can be suppressed. As a result, the reliability of the semiconductor device is improved.

Further, electric field distribution which is similar to electric field distribution below the gate trench TRg can be formed below the termination trench by making the thicknesses of the second lower insulating film FIL2 of the termination trench TRe and the first lower insulating film FIL1 of the gate trench TRg equal to each other and making the depths of the termination trench TRe and the gate trench TRg equal to each other. That is, more uniform electric field distribution can be formed below all of the gate trenches TRg arranged longitudinally and the termination trench TRe, and thus the occurrence of a singularity where withstand voltage is low can be suppressed.

Here, the effect obtained by making the depth of the termination trench TRe and the depth of the gate trench TRg equal to each other will be studied. A depletion layer and an avalanche current pathway in a state where high voltage is applied between the source and the drain are illustrated in FIGS. 13A and 13B.

Figure 13A:
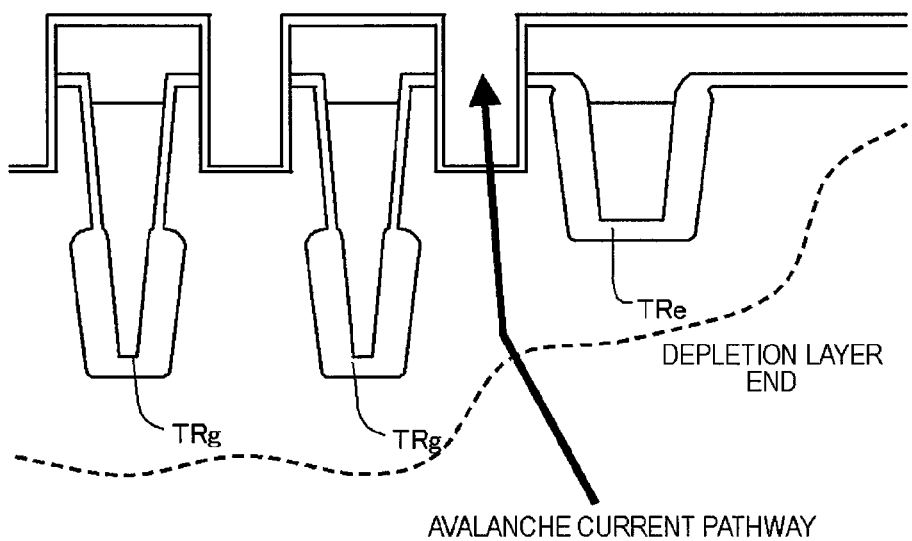
FIGS. 13A and 13B are diagrams for describing the effect of the first embodiment.

FIG. 13A illustrates a result in a case where the depth of the termination trench TRe is shallower than the depth of the gate trench TRg. FIG. 13B illustrates a result in a case where the depth of the termination trench TRe is the same as the depth of the gate trench TRg.

In FIG. 13A, the depth of the termination trench TRe (in the drawing, the rightmost trench) is shallower than the depths of the gate trenches TRg (in the drawing, the trenches other than the termination trench). For this reason, the electric field distribution between the gate trench TRg and the gate trench TRg and the electric field distribution between the gate trench TRg and the termination trench TRe are different from each other, and thus a singularity where withstand voltage is low occurs between the gate trench TRg and the termination trench TRe. That is, even if withstand voltage is improved by covering the side wall of the termination trench TRe with a thick insulating film, since the electric field distribution is non-uniform, a breakdown occurs between the gate trench TRg and the termination trench TRe.

Figure 13B:
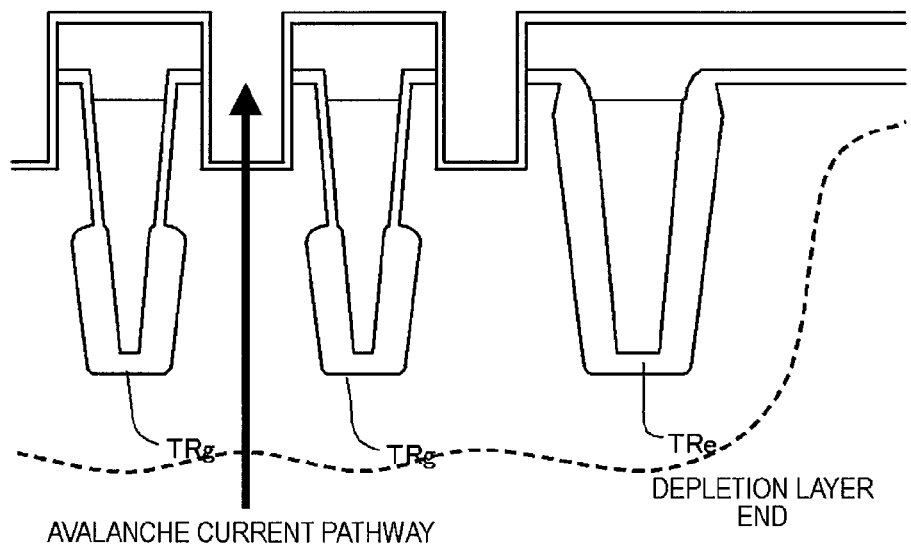

On the other hand, in FIG. 13B, the depth of the termination trench TRe (in the drawing, the rightmost trench) is the same as the depths of the gate trenches TRg (in the drawing, the trenches other than the termination trench). For this reason, the electric field distribution between the gate trench TRg and the gate trench TRg and the electric field distribution between the gate trench TRg and the termination trench TRe become substantially uniform, and thus a singularity where withstand voltage is low does not exist between the gate trench TRg and the termination trench TRe.

In a vertical metal oxide semiconductor field-effect transistor (MOSFET) that the above-described semiconductor device has, if a predetermined voltage is applied between the gate electrode GE and the source wiring Ms such that the gate electrode GE has a high potential, a channel is formed in the p-type region PR facing the gate electrode GE. Then, an electric current flows between the drain and the source through the channel.

Next, a method of manufacturing the semiconductor device described above will be described with reference to FIGS. 5A to 10C. All of FIGS. 5A to 10C correspond to a cross-sectional view in the vicinity of line Y-Y of FIG. 3. In addition, a cross-sectional view in the vicinity of line X-X of FIG. 3 will not be illustrated and described. However, each structure of the lead-out trench TRdo and the inside thereof is formed at the same time when each structure of the gate trench TRg and the inside thereof are being formed. Further, in a process of forming the contact hole CTs (described later), the contact hole CTd is formed over the lead-out trench TRd and the contact hole CTe is formed over the termination trench TRe.

Figure 5A:
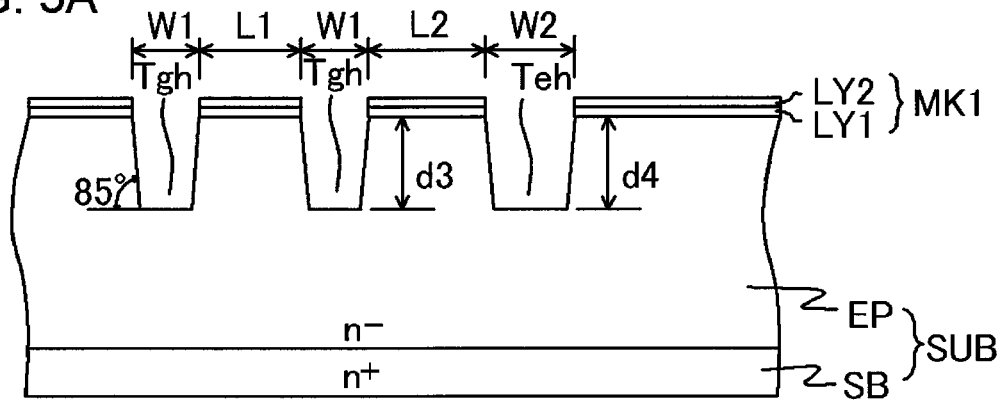
FIGS. 5A to 5C are cross-sectional views illustrating a method of manufacturing a semiconductor device.

First, as illustrated in FIG. 5A, the substrate SUB is prepared in which the n⁻ type epitaxial layer EP is formed on the n⁺ type semiconductor substrate main body SB. Next, a hard mask MK1 in which a first layer LY1 and a second layer LY2 are laminated is formed on the surface of the substrate SUB. The first layer LY1 is, for example, a silicon oxide film, and the second layer LY2 is made of, for example, a silicon nitride film. The hard mask MK1 has openings in areas in which trenches should be formed. Next, an upper trench Tgh and an upper trench Teh are formed at the same time by anisotropically etching the n⁻ type epitaxial layer EP with the hard mask MK1 as a mask. The upper trench Tgh and the upper trench Teh respectively become the gate trench TRg and the termination trench TRe due to formation of lower trenches which will be described later. Here, the width W2 of the upper trench Teh is wider than the width W1 of the upper trench Tgh. Further, a depth d4 (a distance from the surface of the substrate to the bottom surface of the trench) of the upper trench Teh is almost the same depth as a depth d3 of the upper trench Tgh. However, since the trench width is wide, the depth becomes slightly deeper (d4≥d3). Further, the distance L2 between the upper trench Teh and the upper trench Tgh is almost the same as or slightly narrower than the distance L1 between the upper trenches Tgh and Tgh (L2≤L1).

In addition, in order to make embedability better, it is preferable to provide an inclination angle of about 85° on the side surfaces of the upper trenches Tgh and Teh. The inclination angle is provided, for example, by performing etching using reaction gas CBrF3 which includes carbon. In this method, carbon synthesizes organic matter (popular name: depot) in plasma and this sticks to the side surface of the trench and functions as an etching mask. In this way, an inclination angle is formed on the side surface with the progress of the etching. Then, if carbon in the reaction gas is large, the inclination angle becomes large.

In addition, a method of providing the inclination angle is not particularly limited thereto. An inclination angle may be provided by, for example, a method in which after formation of a trench opening, isotropic etching is performed so as to retreat the vicinity of a peripheral border portion of the trench opening of an etching mask and etching is then performed by using Chemical Dry Etching (CDE).

Figure 5B:
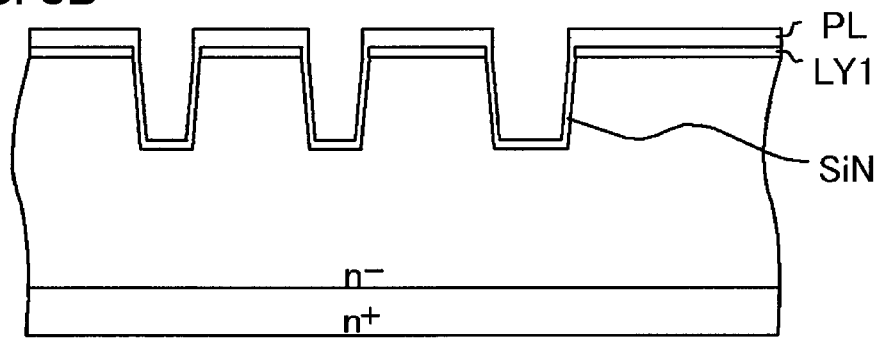

Next, as illustrated in FIG. 5B, a protective film PL, for example, a nitride film (SiN) is formed on the entire surface of the substrate which includes the inner surfaces of the upper trenches Tgh and Teh by using a chemical vapor deposition (CVD) method. In addition, in this drawing or later, the second layer LY2 is illustrated as a portion of the protective film PL.

Figure 5C:
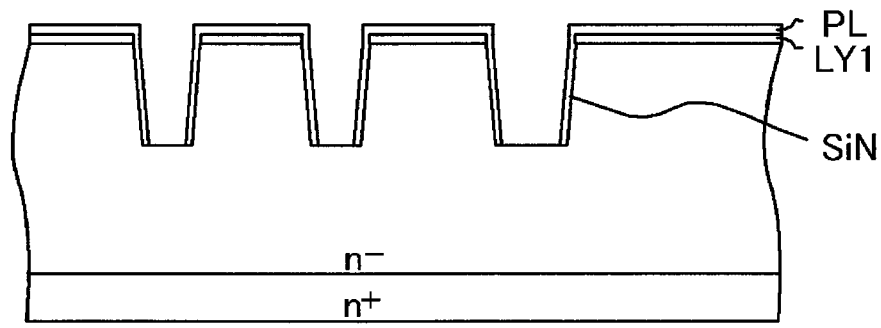

Next, as illustrated in FIG. 5C, the protective film PL on the bottom surface of the upper trench Tgh and the protective film PL on the bottom surface of the upper trench Teh are removed by using anisotropic etching.

Figure 6A:
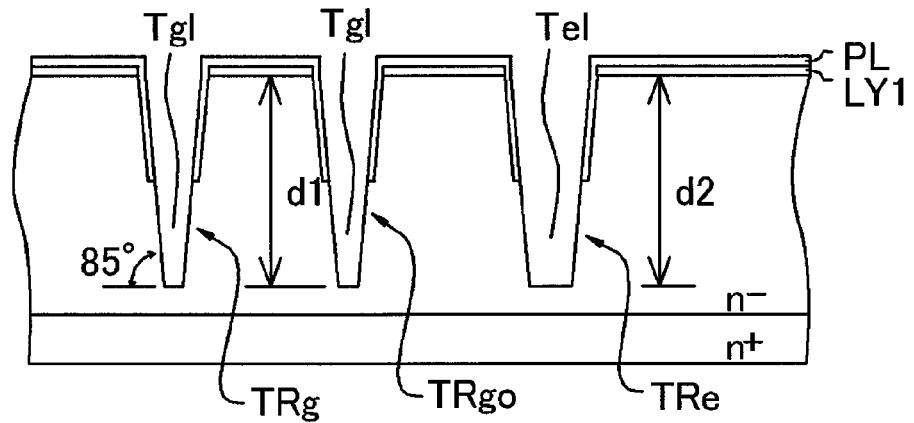
FIGS. 6A to 6C are cross-sectional views illustrating the method of manufacturing a semiconductor device.

Next, as illustrated in FIG. 6A, a lower trench Tgl and a lower trench Tel are formed at the same time by further anisotropically etching the n⁻ type epitaxial layer EP with the protective film PL as a mask. In this way, the gate trench TRg and the termination trench TRe are formed at the same time. That is, the depth d1 of the gate trench TRg becomes almost the same depth as the depth d2 of the termination trench TRe. However, since the width is wide, the depth becomes slightly deeper (d1≤d2). In addition, in order to make embedability better, an inclination angle of about 85° is also provided on the side surfaces of the lower trenches Tgl and Tel. A method of providing the inclination angle is the same as the method described above.

Figure 6B:
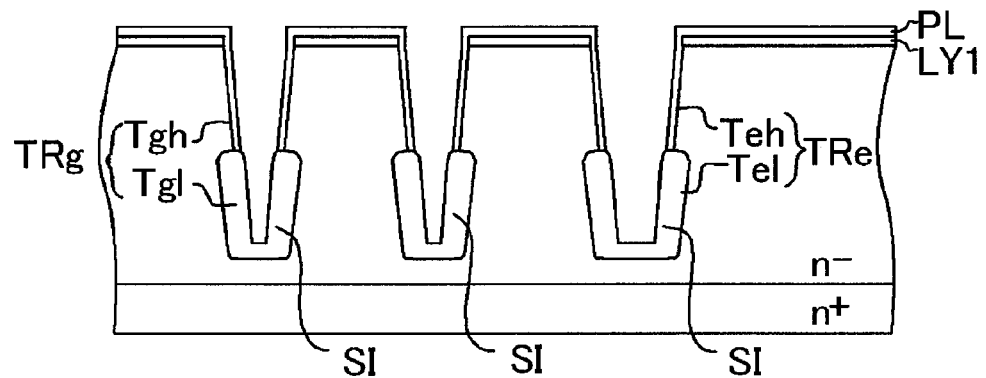

Next, as illustrated in FIG. 6B, oxidation by Local Oxidation of Silicon (LOCOS) is performed with the protective film PL as a mask. In this way, thick insulating films SI are formed on the inner walls of the lower trenches Tgl and Tel.

Figure 6C:
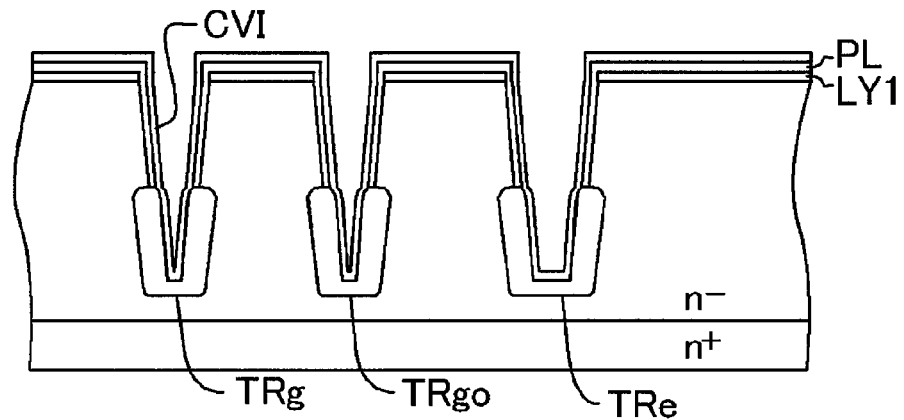

Next, as illustrated in FIG. 6C, a CVD insulating film CVI is formed on the substrate surface which includes the inner surface of the gate trench TRg and the inner surface of the termination trench TRe by using a CVD method.

Figure 7A:
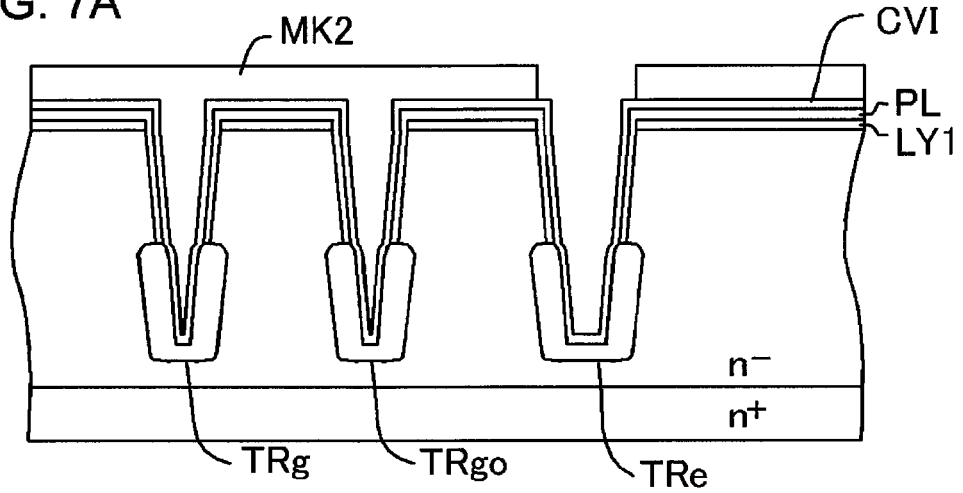
FIGS. 7A to 7C are cross-sectional views illustrating the method of manufacturing a semiconductor device.

Next, as illustrated in FIG. 7A, a resist mask MK2 is formed on the substrate. The resist mask MK2 has an opening in the area of the termination trench TRe.

Figure 7B:
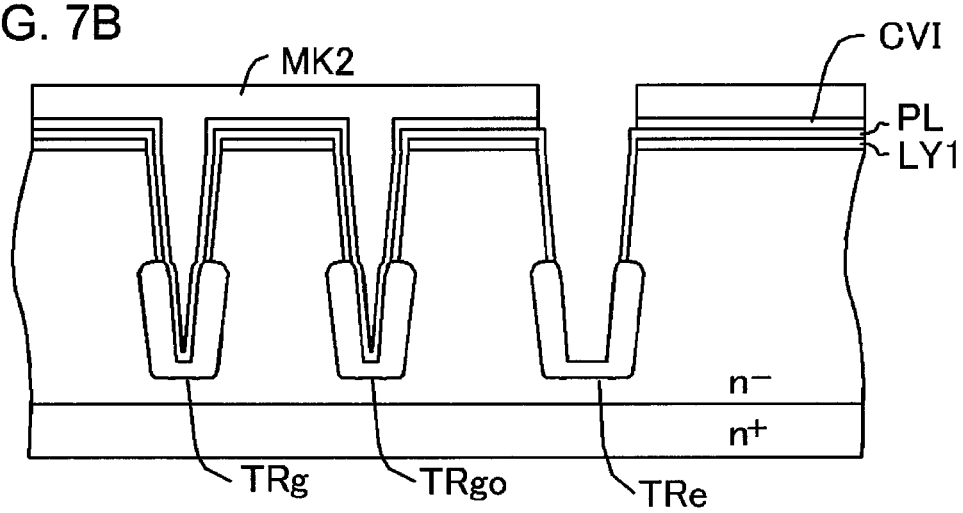

Next, as illustrated in FIG. 7B, wet etching is performed with the resist mask MK2 as a mask. In this way, the CVD insulating film CVI on the inner surface of the termination trench TRe is removed.

Figure 7C:
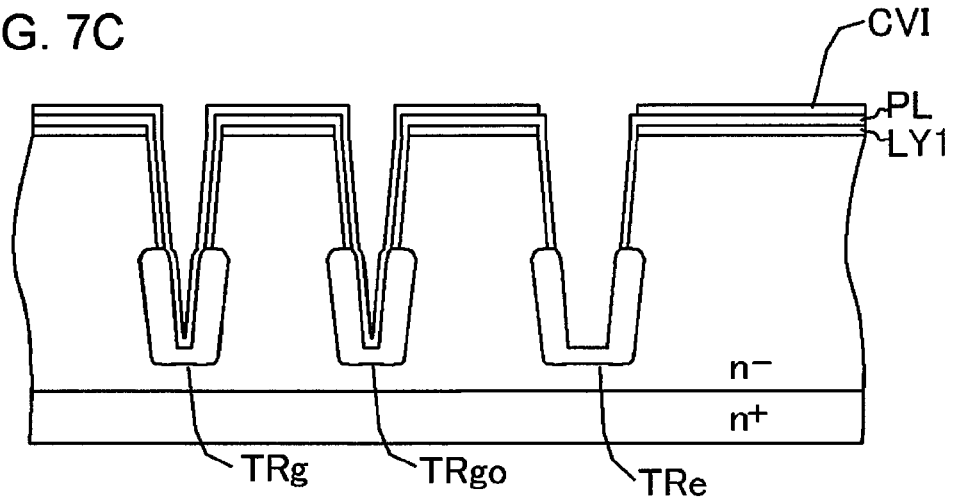

Next, as illustrated in FIG. 7C, the resist mask MK2 is removed.

Figure 8A:
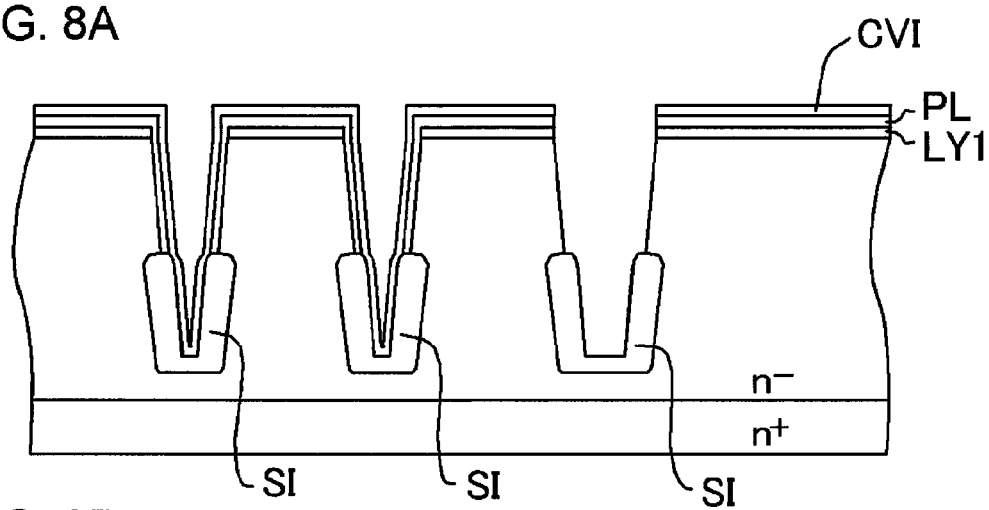
FIGS. 8A to 8C are cross-sectional views illustrating the method of manufacturing a semiconductor device.

Next, as illustrated in FIG. 8A, the protective film PL on the inner surface of the termination trench TRe is removed by a hot phosphoric acid with the CVD insulating film CVI as a mask. Since the CVD insulating film CVI has excellent acid resistance compared to the resist mask, the CVD insulating film CVI is suitable as a mask of this process.

Figure 8B:
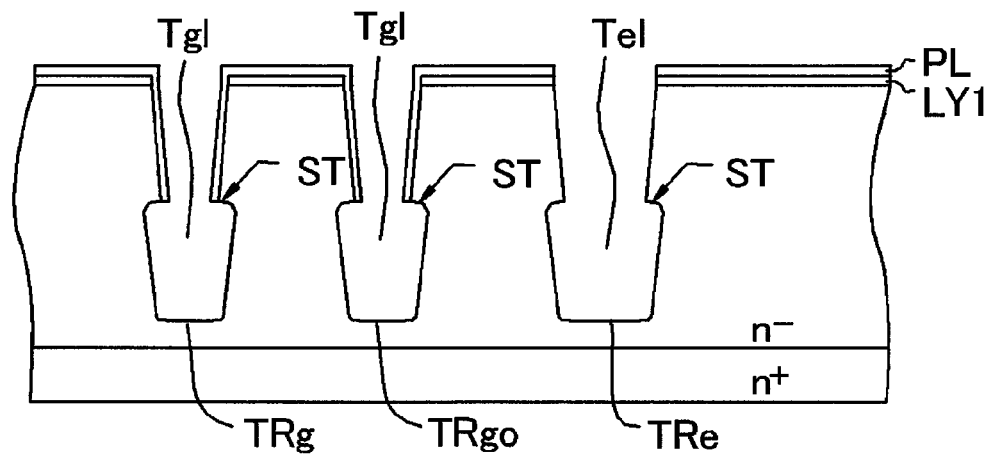

Next, as illustrated in FIG. 8B, the CVD insulating film CVI and the insulating film SI are removed by wet etching. In this way, the lower trenches Tgl and Tel are extended in the lateral direction. The extension dimension can be set to be an arbitrary dimension by changing the film thickness of the insulating film SI. Further, a step ST is formed at the boundary between each of the lower trenches Tgl and Tel and each of the upper trenches Tgh and Teh.

Figure 8C:
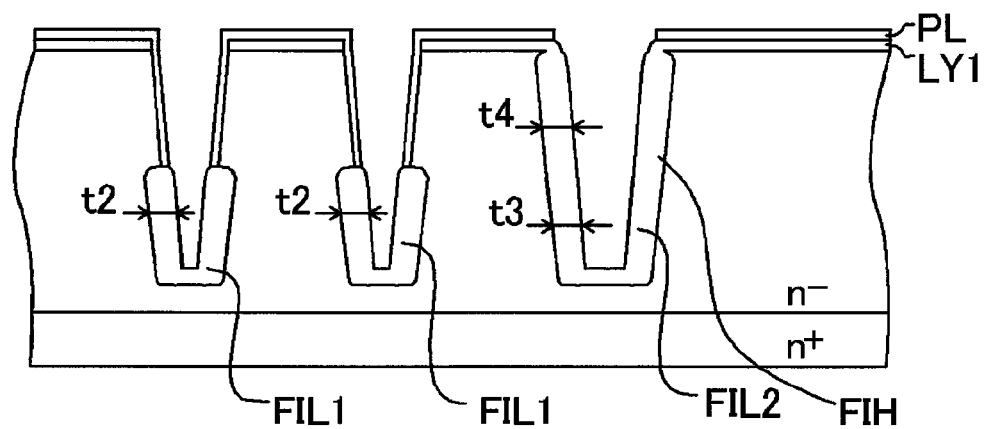

Next, as illustrated in FIG. 8C, LOCOS oxidation is performed with the protective film PL as a mask. In this way, the first lower insulating film FIL1 is formed at a lower portion of the inner wall of the gate trench TRg and the second lower insulating film FIL2 and the upper insulating film FIH are formed on the inner wall of the termination trench TRe. Here, all of the thickness t2 of the first lower insulating film FIL1 of the gate trench TRg, the thickness t3 of the second lower insulating film FIL2 of the termination trench TRe, and the thickness t4 of the upper insulating film FIH of the termination trench TRe are the same thickness (t2=t3=t4). That is, in this process, the boundary between the second lower insulating film FIL2 and the upper insulating film FIH is almost not formed. In addition, the thickness t4 may be greater than or equal to 95% and less than or equal to 105% of the thickness t3.

Figure 9A:
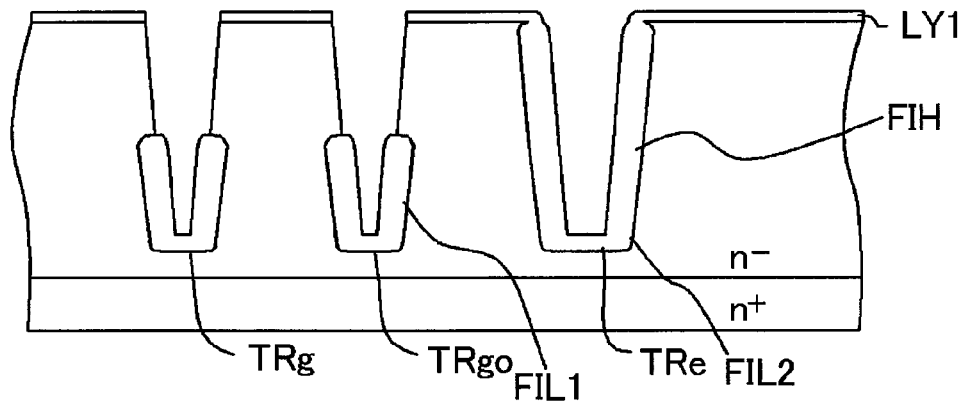
FIGS. 9A to 9C are cross-sectional views illustrating the method of manufacturing a semiconductor device.

Next, as illustrated in FIG. 9A, the protective film PL is removed by etching using a hot phosphoric acid.

Figure 9B:
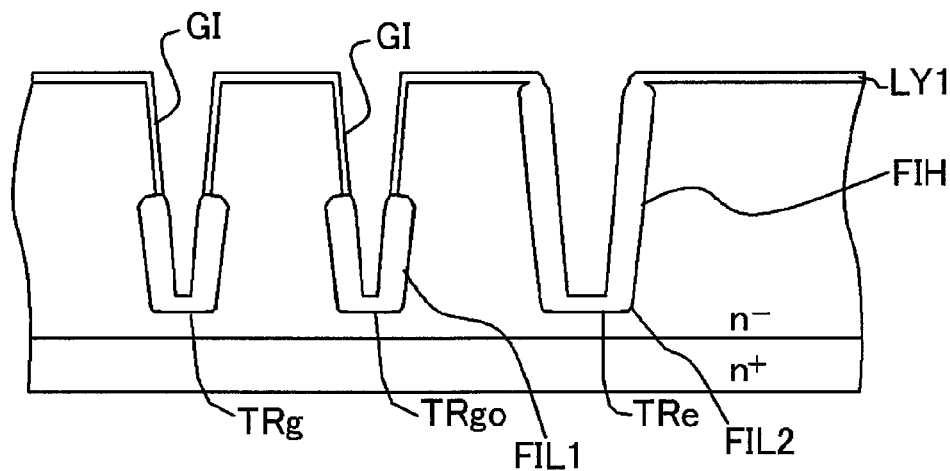

Next, as illustrated in FIG. 9B, the gate insulating film GI is formed on the upper inner wall of the gate trench TRg by using a thermal oxidation method. At this time, the first lower insulating film FIL1, the second lower insulating film FIL2, and the upper insulating film FIH are also subjected to oxidation and thus become slightly thicker.

Figure 9C:
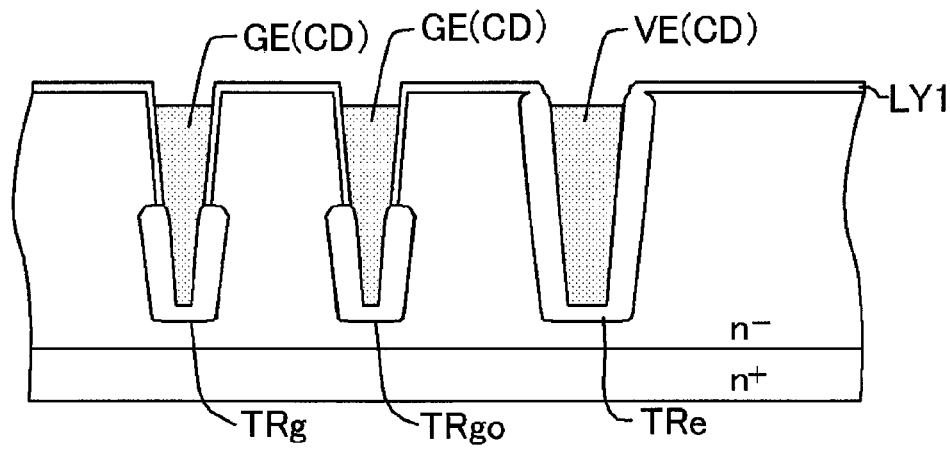

Next, as illustrated in FIG. 9C, after the electric conductor CD made of, for example, doped polysilicon is deposited on the entire surface of the substrate, etch-back is performed. In this way, the gate electrode GE is formed in the gate trench TRg and the embedded electrode VE is formed in the termination trench TRe. In addition, although it is not illustrated in the drawing, the lead-out electrode TE is formed in the lead-out trench TRdo.

Figure 10A:
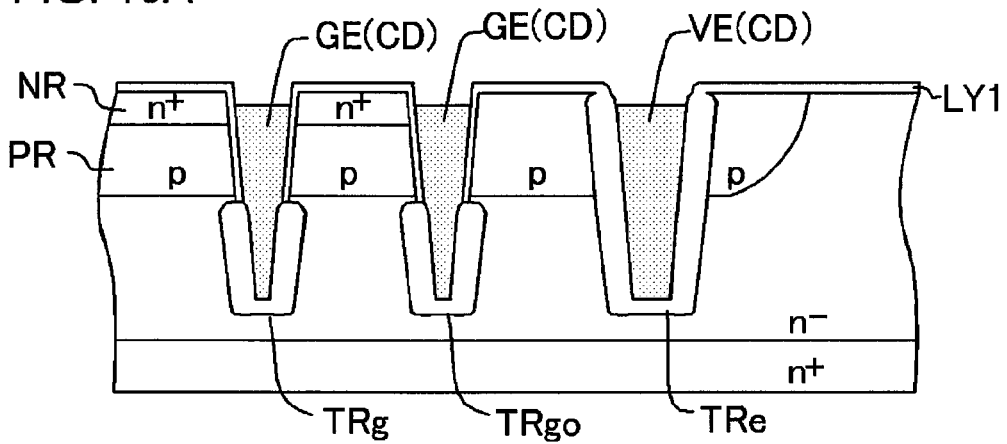
FIGS. 10A to 10C are cross-sectional views illustrating the method of manufacturing a semiconductor device.

Next, as illustrated in FIG. 10A, p-type impurities and n-type impurities are respectively introduced into predetermined areas to predetermined depths by an ion implantation process using a resist pattern. In this way, the p-type region PR and the n-type region NR are formed.

Figure 10B:
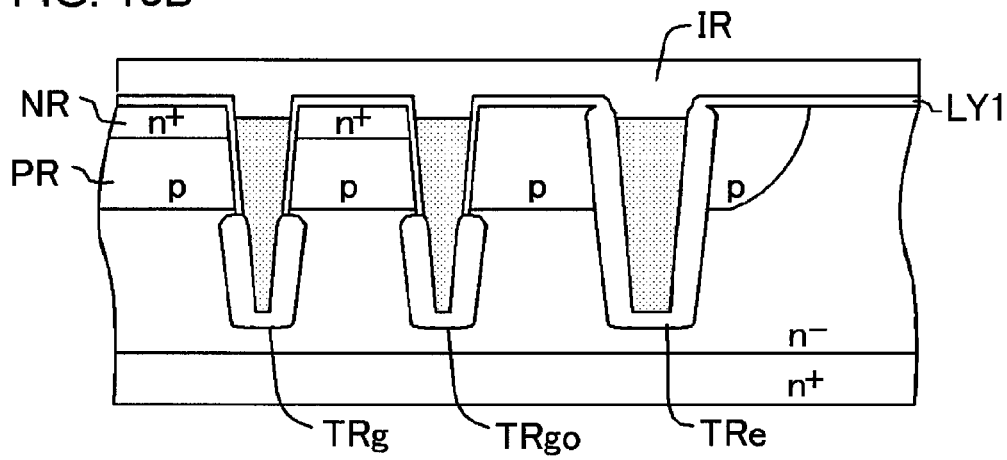
Figure 10C:
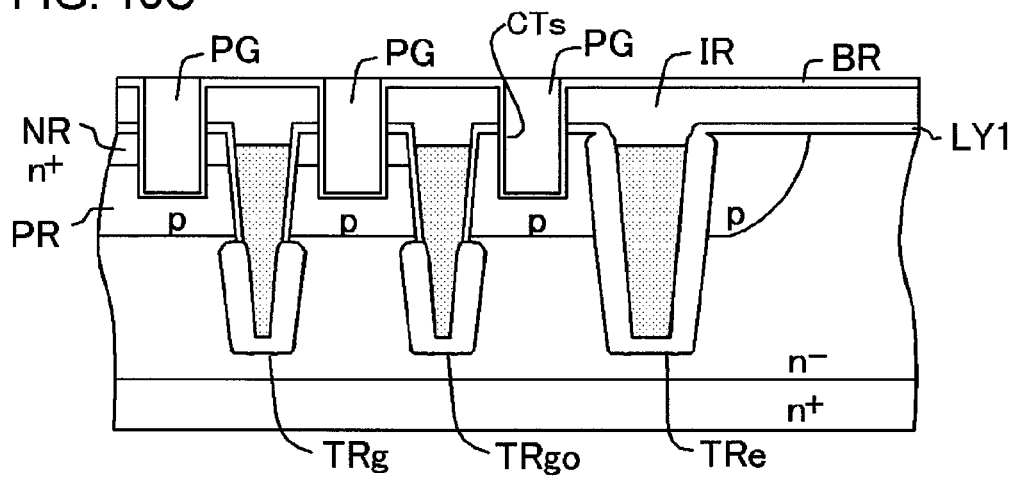

Next, as illustrated in FIG. 10B, an insulating interlayer IR is formed on the substrate.

Next, as illustrated in FIG. 10O, the contact hole CTs is formed. The contact hole CTs passes through the insulating interlayer IR, the first layer LY1 (the insulating film IL1), and the n-type region NR and reaches the halfway depth of the p-type region PR. Thereafter, after the barrier metal BR made of, for example, titanium/titanium nitride is formed on the entire surface, the plug PG made of, for example, tungsten is formed in the contact hole CTs.

Next, a conductive film is formed by using a sputtering method or an evaporation method and the conductive film is then selectively removed. In this way, the source wiring Ms and the gate wiring Mg are formed on the surface of the substrate. Thereafter, after passivation films (not illustrated) are formed over these wirings, the opening portions Ops and OPg for bonding are formed in the passivation films (not illustrated). Finally, the back electrode BE is formed on the rear surface of the substrate, and thus the semiconductor device as illustrated in FIGS. 1A to 4B is completed.

According to the method of manufacturing the semiconductor described above, since the gate trench TRg and the termination trench TRe are formed at the same time, the two can be formed in almost the same depth. Further, since the first lower insulating film FIL1 of the gate trench TRg and the second lower insulating film FIL2 on the inner wall of the termination trench TRe are formed at the same time, the two can be formed in almost the same thickness.

In addition, in the above description, the vertical transistor is an n-channel MOSFET. However, the vertical transistor may be a p-channel MOS.

(Second Embodiment)

Figure 11:
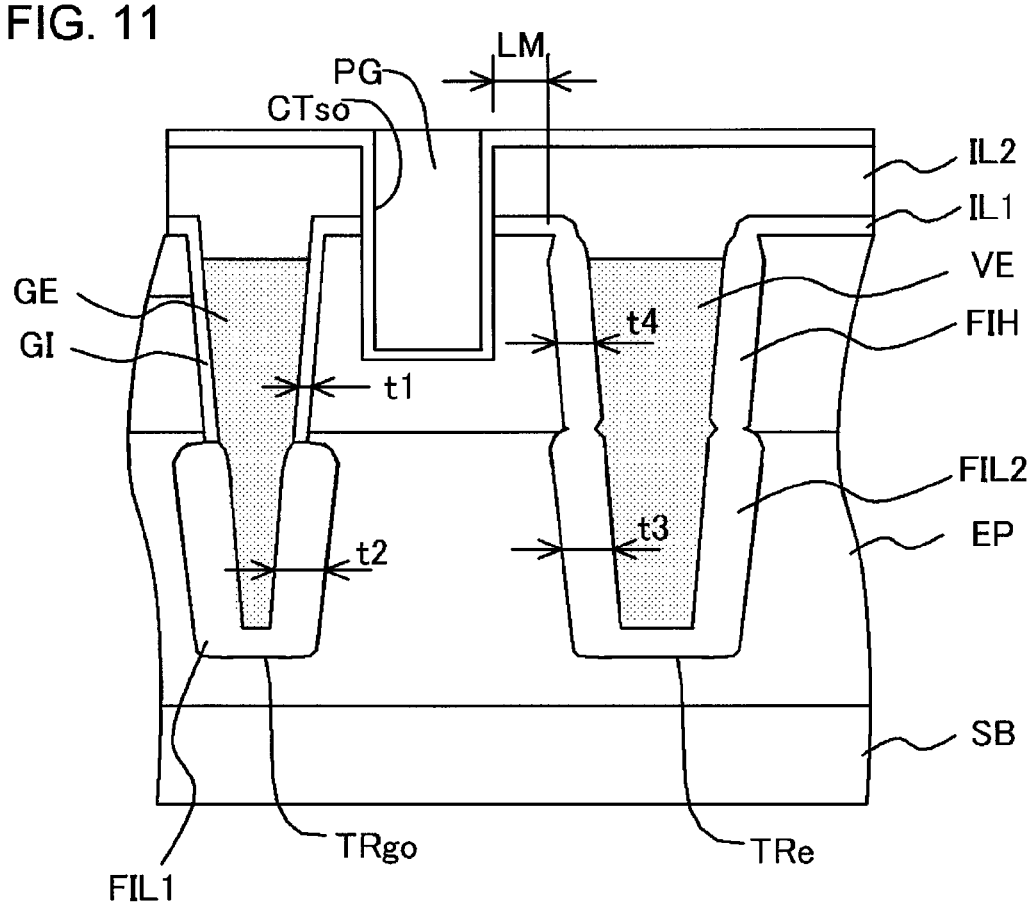
FIG. 11 is a cross-sectional view illustrating the configuration of a semiconductor device according to a second embodiment.

FIG. 11 is a cross-sectional view illustrating the configuration of a semiconductor device according to a second embodiment. The semiconductor device according to this embodiment has the same configuration as that of the semiconductor device according to the first embodiment except that the thickness t4 of the upper insulating film FIH is thicker than the thickness t1 of the gate insulating film GI and thinner than the thickness t3 of the second lower insulating film FIL2 (t1<t4<t3).

In order to improve dielectric breakdown resistance of the insulating film, the thicker the thicknesses of the insulating films (the upper insulating film FIH and the second lower insulating film FIL2) which cover the inner wall of the termination trench TRe, the better. However, if the thicknesses of the insulating films are thickened more and more without increasing the distance L2 between the outermost gate trench TRgo and the termination trench TRe, a process margin LM to form the contact hole CTso is reduced.

In contrast, in this embodiment, the thickness t3 of the second lower insulating film FIL2 can be made sufficiently thick in terms of the dielectric breakdown characteristic of the insulating film. Further, the thickness t4 of the upper insulating film FIH can be set to be a thickness in which both the withstand voltage and the securing of the process margin LM can be achieved.

Hereinafter, an example of a method of manufacturing the semiconductor device according to the second embodiment will be described with reference to FIGS. 12A to 12C.

The method of manufacturing the semiconductor device according to this embodiment has the same manufacturing flow as that to FIG. 8A described in the manufacturing method according to the first embodiment and description thereof will not be repeated. FIG. 12A corresponds to FIG. 8A.

Figure 12A:
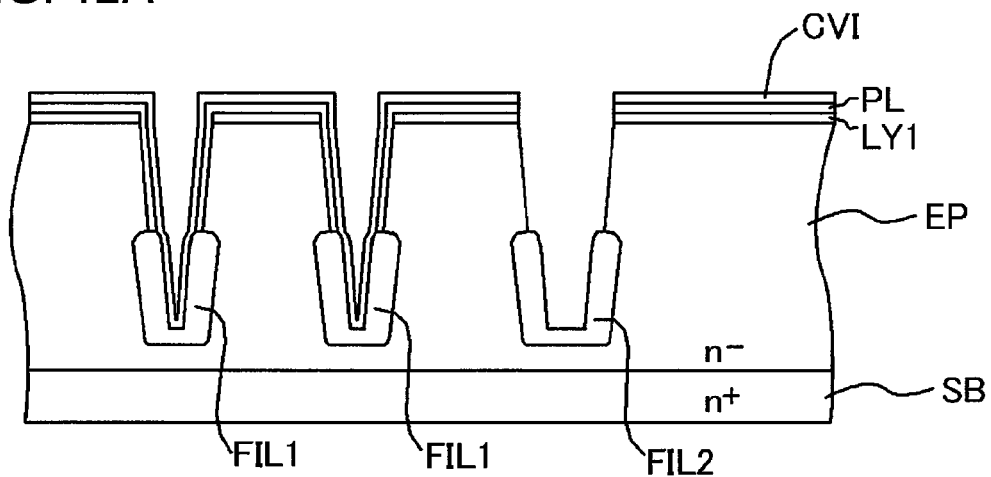
FIGS. 12A to 12C are cross-sectional views illustrating a method of manufacturing the semiconductor device according to the second embodiment.

As illustrated in FIG. 12A, the protective film PL on the inner surface of the termination trench TRe is removed by a hot phosphoric acid with the CVD insulating film CVI as a mask.

Figure 12B:
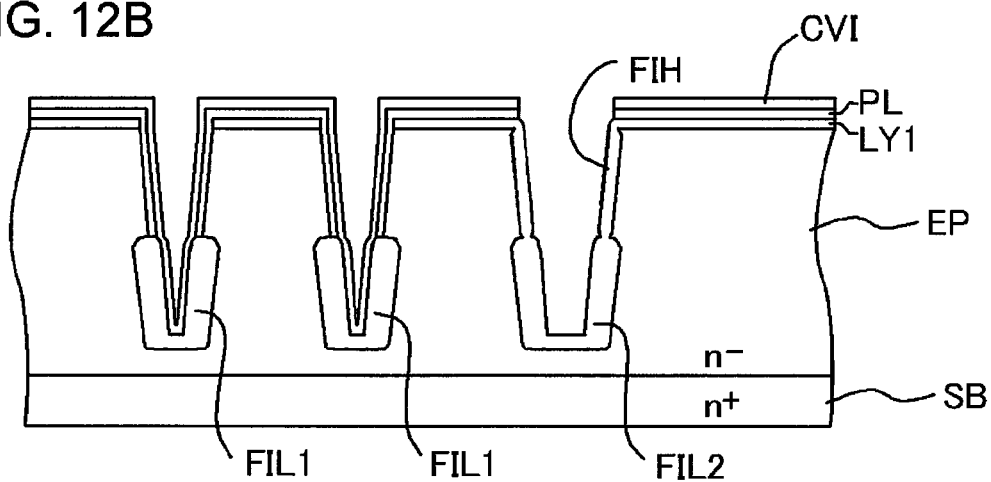

Next, as illustrated in FIG. 12B, LOCOS oxidation is performed with the protective film PL as a mask. In this way, the upper insulating film FIH is formed on the upper side wall of the termination trench TRe. At this time, since the upper side wall of the gate trench TRg is masked by a laminated film of the protective film PL and the CVD insulating film, oxidation does not proceed. Further, since the first lower insulating film FIL1 of the gate trench TRg and the second lower insulating film FIL2 of the termination trench TRe are thick, the amount of increase in thickness is small compared to the thickness of the upper insulating film FIH.

Figure 12C:
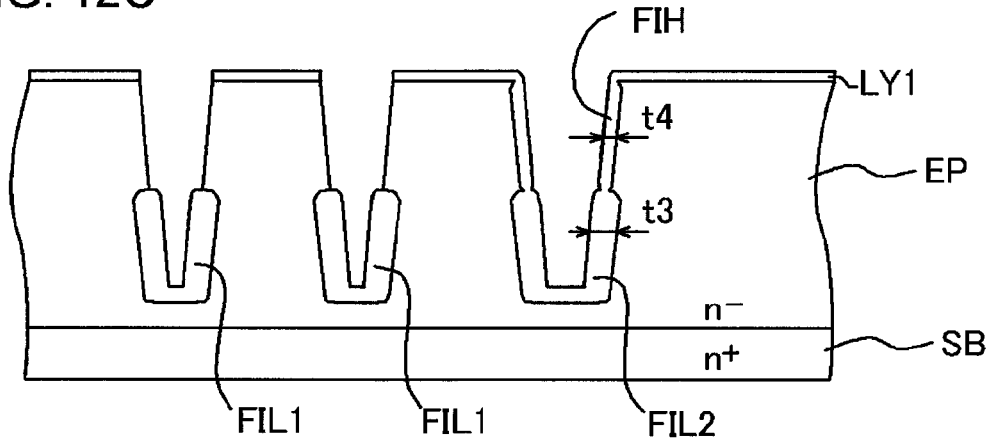

Next, as illustrated in FIG. 12C, the CVD insulating film is removed by wet etching. At this time, the thicknesses of the lower insulating films FIL of the gate trench TRg and the termination trench TRe are also partially etched. Thereafter, the protective film PL is removed by hot phosphoric acid.

By controlling the LOCOS oxidation conditions in the process of FIG. 12B, in the step of FIG. 12C, it is possible to make the thickness of the first lower insulating film FIL1 of the gate trench TRg, the thickness of the second lower insulating film FIL2 of the termination trench TRe, and the thickness of the upper insulating film FIH of the termination trench TRe respectively be the predetermined thicknesses t2, t3, and t4. However, in terms of dielectric breakdown resistance of the insulating film, the thickness t4 of the upper insulating film FIH of the termination trench TRe is made thicker than the thickness t1 of the gate insulating film GI.

Since the subsequent processes follow the manufacturing flow of FIGS. 9B to 10C in the first embodiment, description thereof will not be repeated.

Also by this embodiment, it is possible to obtain the same effects as those in the first embodiment. Further, it is possible to make the thickness t4 of the upper insulating film FIH of the termination trench TRe thinner than the thickness t3 of the second lower insulating film FIL2. In this way, it is possible to set the thickness t4 of the upper insulating film FIH to be a thickness in which both the withstand voltage and the securing of the process margin LM can be achieved, even without changing the thicknesses of the first lower insulating film FIL1 and the second lower insulating film FIL2.

The invention made by the inventors has been specifically described based on the above embodiments. However, the invention is not limited to the embodiments described above and it goes without saying that various changes can be made within a scope which does not depart from the gist of the invention.

It is apparent that the present invention is not limited to the above embodiment, and may be modified and changed without departing from the scope and spirit of the invention.

What is claimed is:

1. A semiconductor device comprising:
a first conductivity type drain layer;
a first conductivity type low-concentration impurity layer which is formed over the drain layer and has lower impurity concentration than the drain layer;
a second conductivity type base layer which is located over the low-concentration impurity layer;
a gate insulating film formed at an upper portion of a side surface of a first concave portion which is formed in the base layer and has a lower end located in the low-concentration impurity layer;
a first lower insulating film which is formed on a bottom surface and a lower portion of the side surface of the first concave portion, is thicker than the gate insulating film, and is connected to the gate insulating film;
a gate electrode embedded in the first concave portion;
a first conductivity type source layer which is formed in the base layer to be shallower than the base layer and is located next to the first concave portion when seen in a plan view;
a second lower insulating film formed on a bottom surface and a lower portion of a side surface of a second concave portion surrounding the first concave portion when seen in a plan view;
an upper insulating film which is formed at an upper portion of the side surface of the second concave portion and connected to the second lower insulating film; and
an embedded electrode embedded in the second concave portion,
wherein a depth of the second concave portion is greater than or equal to 90% and less than or equal to 110% of a depth of the first concave portion,
a thickness of the second lower insulating film is greater than or equal to 95% and less than or equal to 105% of a thickness of the first lower insulating film, and
the upper insulating film is thicker than the gate insulating film.

2. The semiconductor device according to claim 1, wherein the upper insulating film is greater than or equal to 95% and less than or equal to 105% of a thickness of the second lower insulating film.

3. The semiconductor device according to claim 1, wherein a plurality of first concave portions is formed parallel to each other,
the gate insulating film, the first lower insulating film, and the gate electrode are formed in each of the plurality of first concave portions, and
a distance between the plurality of first concave portions is equal to a distance between the first concave portion closest to the second concave portion and the second concave portion.

4. The semiconductor device according to claim 1, further comprising:
a third concave portion which is connected to the first concave portion;
a lead-out electrode which is formed in the third concave portion and connected to the gate electrode;
a first contact which is connected to the lead-out electrode; and
a second contact which is connected to the embedded electrode,
wherein the first lower insulating film is formed at a lower portion of the third concave portion and an insulating film having the same thickness as the gate insulating film is formed at an upper portion of the third concave portion, and
the upper insulating film is thinner than the second lower insulating film.

5. A method of manufacturing a semiconductor device, comprising:
forming a first concave portion, and forming a second concave portion surrounding the first concave portion in a first surface of a laminated substrate, in which are laminated a first conductivity type semiconductor substrate and a first conductivity type semiconductor layer having lower impurity concentration than the semiconductor substrate;
covering, with a protective film, the first surface of the laminated substrate and an upper portion of a side surface of the first concave portion, but not a side surface of the second concave portion, so that said side surface is free of said protective film;
forming a first insulating film, which is located at a lower portion of the side surface and a bottom surface of the first concave portion, and a second insulating film, which is located on a side surface and a bottom surface of the second concave portion, by thermally oxidizing the first concave portion and the second concave portion with the protective film as a mask;
after the forming of the first insulating film and the second insulating film, removing the protective film;
after the removing of the protective film, forming a gate insulating film which is thinner than the first insulating film and the second insulating film at an upper portion of the side surface of the first concave portion, by thermally oxidizing the first concave portion;
embedding a gate electrode in the first concave portion; and
forming an embedded electrode in the second concave portion.

6. A method of manufacturing a semiconductor device, comprising:

forming a first concave portion, and forming a second concave portion surrounding the first concave portion in a first surface of a laminated substrate, in which are laminated a first conductivity type semiconductor substrate and a first conductivity type semiconductor layer having lower impurity concentration than the semiconductor substrate;

covering, with a protective film, an upper portion of a side surface of the first concave portion, an upper portion of a side surface of the second concave portion, and the first surface of the laminated substrate;

forming a first insulating film, which is located at a lower portion of the side surface and a bottom surface of the first concave portion, and a second insulating film, which is located on a lower portion of the side surface and a bottom surface of the second concave portion, by thermally oxidizing the first concave portion and the second concave portion with the protective film as a mask;

after the forming of the first insulating film and the second insulating film, removing the protective film at the upper portion of the side surface of the second concave portion, after the removing the protective film at the upper portion of the side surface of the second concave portion, forming a third insulating film, thinner than the second insulating film, at the upper portion of the side surface of the second concave portion by thermally oxidizing the first concave portion and the second concave portion with the protective film as a mask;

after the forming of the third insulating film, removing the protective film; at the upper portion of a side surface of the first concave portion and the first surface of the laminated substrate;

after the removing of the protective film, forming a gate insulating film which is thinner than the third insulating film at an upper portion of the side surface of the first concave portion by thermally oxidizing the first concave portion;

embedding a gate electrode in the first concave portion; and forming an embedded electrode in the second concave portion.

* * * * *